United States Patent
Han et al.

(10) Patent No.: US 10,515,962 B2
(45) Date of Patent: Dec. 24, 2019

(54) SEMICONDUCTOR DEVICE

(71) Applicant: Samsung Electronics Co., Ltd., Suwon-si, Gyeonggi-do (KR)

(72) Inventors: Seung Uk Han, Suwon-si (KR); Taek Yong Kim, Seoul (KR); Satoru Yamada, Yongin-si (KR); Jun Hee Lim, Seoul (KR); Ki Jae Hur, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/827,231

(22) Filed: Nov. 30, 2017

(65) Prior Publication Data

US 2018/0294264 A1    Oct. 11, 2018

(30) Foreign Application Priority Data

Apr. 7, 2017 (KR) .................. 10-2017-0045150

(51) Int. Cl.
*H01L 27/092* (2006.01)
*G11C 11/408* (2006.01)
*H01L 21/762* (2006.01)
*H01L 21/8238* (2006.01)
*H01L 29/423* (2006.01)
*H01L 23/522* (2006.01)
(Continued)

(52) U.S. Cl.
CPC ........ *H01L 27/092* (2013.01); *G11C 11/4085* (2013.01); *H01L 21/76229* (2013.01); *H01L 21/823878* (2013.01); *G11C 11/4097* (2013.01); *H01L 23/5226* (2013.01); *H01L 23/5283* (2013.01); *H01L 27/0207* (2013.01); *H01L 29/4238* (2013.01); *H01L 29/42376* (2013.01)

(58) Field of Classification Search
CPC .............. H01L 27/092; H01L 27/0207; H01L 21/76229; H01L 21/823878; H01L 29/4238; H01L 23/5283; H01L 23/5226; H01L 29/42376
See application file for complete search history.

(56) References Cited

U.S. PATENT DOCUMENTS 7,751,273 B2    7/2010 Yang
8,279,703 B2    10/2012 Yang et al.
(Continued)

FOREIGN PATENT DOCUMENTS

KR    2011-0015803 A    2/2011
KR    2015-0119286 A    10/2015
KR    2016-0074907 A    6/2016

*Primary Examiner* — Hoang-Quan T Ho
(74) *Attorney, Agent, or Firm* — Muir Patent Law, PLLC

(57) ABSTRACT

A semiconductor device includes first and second active regions extending in a first direction on a substrate and spaced apart from each other in a second direction intersecting the first direction, wherein the first and second active regions overlaps with each other in the second direction, a third active region extending in the first direction on the substrate and spaced apart from the first active region in the second direction. The first active region is positioned between the second and third active regions in the second direction. The first and third active regions partially overlap in the second direction, and a device isolation film is configured to define the first to third active regions.

20 Claims, 13 Drawing Sheets

(51) Int. Cl.
    *H01L 23/528* (2006.01)
    *H01L 27/02* (2006.01)
    *G11C 11/4097* (2006.01)

(56) References Cited

U.S. PATENT DOCUMENTS

| | | |
|---|---|---|
| 9,318,175 B1 | 4/2016 | Chi |
| 9,461,053 B2 | 10/2016 | Saino |
| 2009/0242996 A1 | 10/2009 | van Bentum et al. |
| 2010/0197097 A1* | 8/2010 | Hasunuma ...... H01L 21/823437 438/284 |
| 2017/0005096 A1* | 1/2017 | Lee ...................... H01L 27/092 |

* cited by examiner

SEMICONDUCTOR DEVICE

CROSS-REFERENCE TO RELATED APPLICATION

This application claims priority from Korean Patent Application No. 10-2017-0045150 filed on Apr. 7, 2017 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device.

2. Description of the Related Art

Hot electron induced punchthrough (HEIP) phenomenon of PMOS transistor is increased along with increased integration density of the semiconductor device. The PMOS transistor uses holes as a carrier and hot electrons are incidentally generated due to the holes. Such hot electrons can be introduced into the gate insulating film adjacent to the channel and invert the channel of the PMOS transistor, thus resulting in reduced length of the channel. Accordingly, the effective channel length is reduced and the undesired channel inversion phenomenon described above causes problem such as increased leakage current at a turn-off timing and subsequently increased power consumption, declined operating velocity, and decreased breakdown voltage.

SUMMARY

According to an aspect of the present inventive concept, there is provided a semiconductor device, comprising first and second active regions extending in a first direction on a substrate and spaced apart from each other in a second direction intersecting the first direction, wherein the first and second active regions are arranged so as to be overlapped entirely with each other in the second direction, a third active region extending in the first direction on the substrate and spaced apart from the first active region in the second direction, wherein the first active region is positioned between the second and third active regions in the second direction, and the first and third active regions are arranged so as to be only partially overlapped in the second direction, a device isolation film configured to define the first to third active regions, wherein the device isolation film comprises a first device isolation film positioned between the first and second active region and a second device isolation film positioned between the first and third active region, and a width of the first device isolation film in the second direction is smaller than a width of the second device isolation film in the second direction and a gate structure formed on the first to third active regions and extending in the second direction.

According to another aspect of the present inventive concept, there is provided a semiconductor device, comprising first and second active regions extending in a first direction on a substrate and spaced apart from each other in a second direction intersecting the first direction, wherein the first and second active regions are arranged so as to be overlapped entirely with each other in the second direction, a third active region extending in the first direction on the substrate and spaced apart from the first active region in the second direction, wherein the first active region is positioned between the second and third active region in the second direction, and the first and third active regions are arranged so as to be only partially overlapped in the second direction, a device isolation film configured to define the first to third active regions, wherein the device isolation film comprises a first device isolation film positioned between the first and second active regions and a second device isolation film positioned between the first and third active regions, the first device isolation film comprises a first liner and a first insulating film formed on the first liner, and a second device isolation film comprises a second liner, a third liner formed on the second liner, and a second insulating film formed on the second liner.

According to still another aspect of the present inventive concept, there is provided a semiconductor device, comprising first and second active regions extending in a first direction on a substrate and spaced apart from each other in a second direction intersecting the first direction, wherein the first and second active regions are arranged so as to be overlapped entirely with each other in the second direction, a third active region extending in the first direction on the substrate and spaced apart from the first active region in the second direction, wherein the first active region is positioned between the second and third active region in the second direction, and the first and third active regions are arranged so as to be only partially overlapped in the second direction, a device isolation film configured to define the first to third active regions and a gate structure formed on the first to third active regions and extending in the second direction, wherein the gate structure comprises a first portion extending on the first and second active regions in the second direction, a second portion extending on the third active region in the second direction, and a third portion connecting the first and second portions and being formed in the second and third active regions, and a width of the third portion in the first direction is greater than widths of the first and second portions in the first direction.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings

DETAILED DESCRIPTION

Hereinbelow, a semiconductor device according to some exemplary embodiments will be described with reference to FIGS. 1 to 9.

Figure 1:
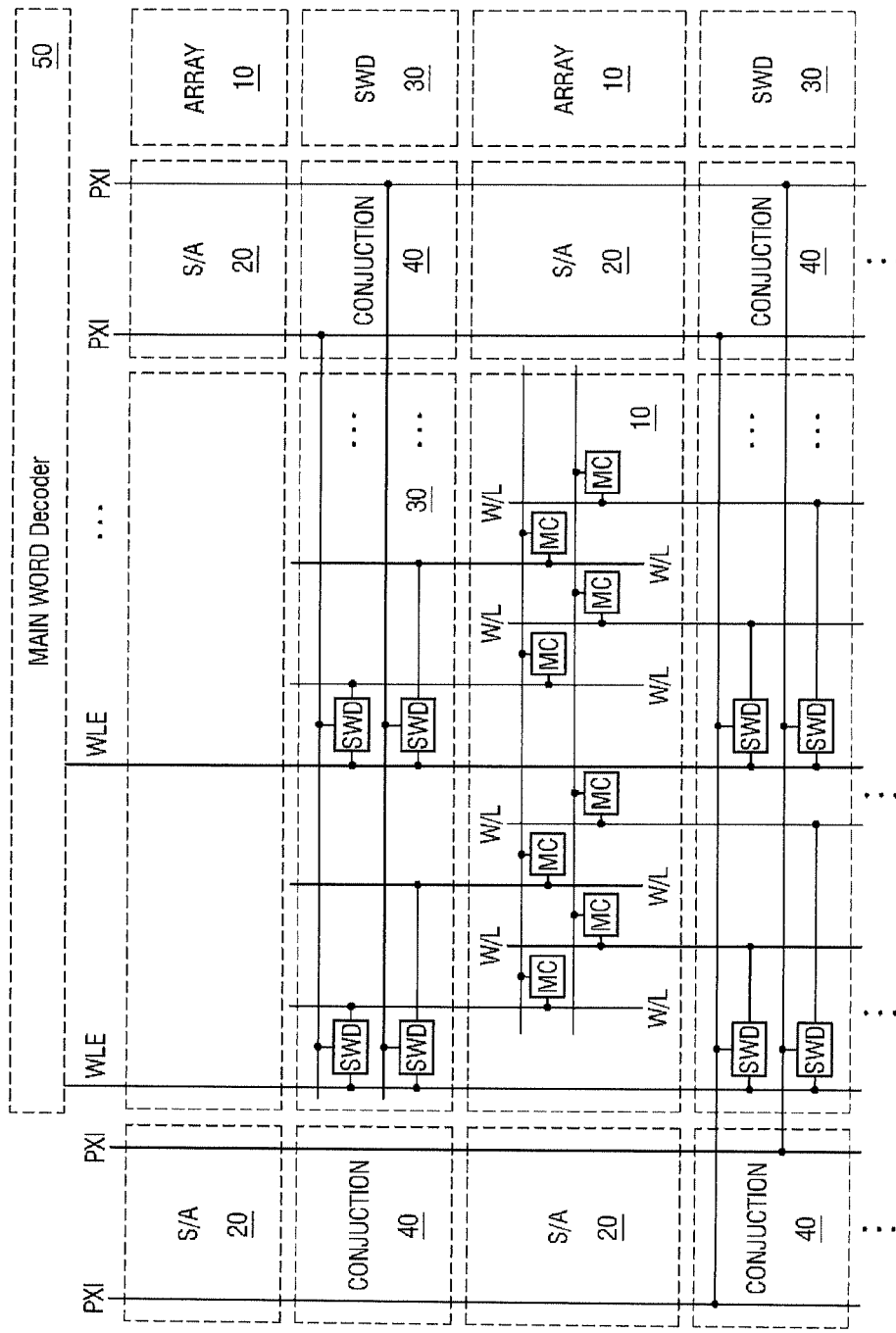
FIG. 1 is a block diagram illustrating a layout of a semiconductor device according to some exemplary embodiments.
Figure 2:
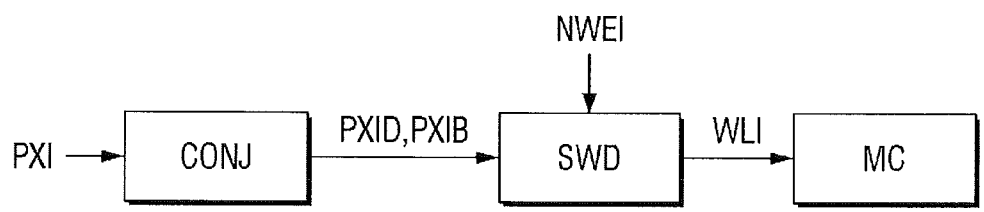
FIG. 2 is a block diagram illustrating a signal of a semiconductor device according to some exemplary embodiments.
Figure 3:
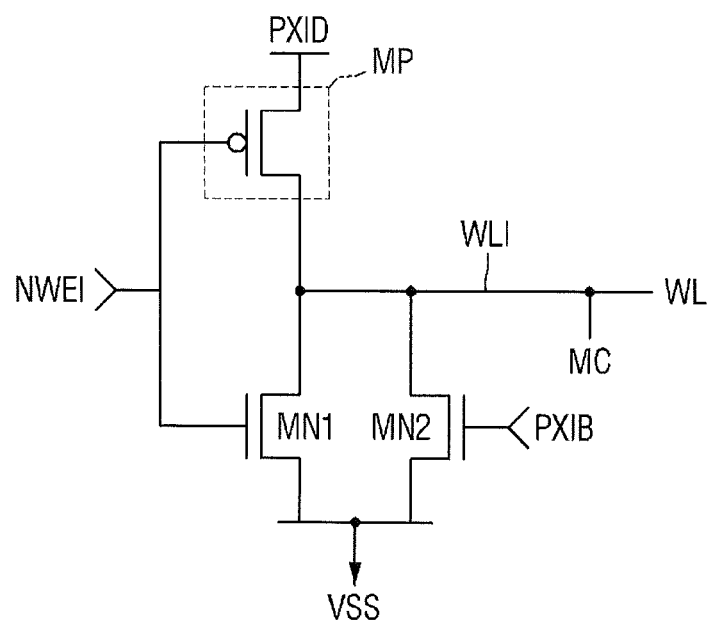
FIG. 3 is an equivalent circuit diagram illustrating a sub word line driver of a semiconductor device according to some exemplary embodiments.

FIG. 1 is a block diagram illustrating a layout of a semiconductor device according to some exemplary embodiments. FIG. 2 is a block diagram illustrating a signal of a semiconductor device according to some exemplary embodiments. FIG. 3 is an equivalent circuit diagram illustrating a sub word line driver of a semiconductor device according to some exemplary embodiments.

Referring to FIG. 1, the semiconductor device according to some exemplary embodiments includes a plurality of sub arrays 10 which are arranged in a matrix form of rows and columns. Each of the sub arrays 10 includes a plurality of word lines (W/L), a plurality of bit lines (B/L), and a plurality of memory cells (MCs) arranged in intersecting regions of the word lines (W/L) and the bit lines (B/L). Sense amplification regions 20 are disposed between the sub arrays arranged in a direction of the bit lines (B/L). Each of the sense amplification regions 20 is provided with a plurality of sense amplifiers (S/A), and each of the sense amplifiers (S/A) is connected to the bit lines (B/L) in the same column of each of the adjacent sub arrays. The sense amplifiers (S/A) in the sense amplification regions 20 are shared by adjacent sub arrays.

Sub word line drive regions 30 are disposed in a direction of the word lines (W/L) on both sides of each sub array 10. A plurality of sub word line drivers (SWD) are provided on each sub word line drive region 30. Some of the word lines (W/L) of each sub array 10 are selected/driven by the sub word line drivers (SWD) arranged on one side (e.g., upper array side), and the other word lines (W/L) are selected/driven by the sub word line drivers (SWD) arranged on the other side (e.g., lower array side). Each of the sub word line drivers (SWD) may select corresponding sub word line in response to a PXI signal from a main word line (WLE) and a PXI generator (not illustrated) which are connected to a main word decoder. Conjunction regions 40 are disposed between the sub word line drive regions 30 adjacent in a direction of the bit lines (B/L).

Referring to FIGS. 1 and 2, a first sub word line control signal (PXID) and a second sub word line control signal (PXIB) may be generated from the conjunction regions 40 based on the PXI signal.

A sub word line driving circuit of the sub word line driver (SWD) may generate a word line driving signal (WLI) based on a main word line driving signal (NEW1), a first sub word line control signal (PXID), and a second sub word line control signal (PXIB), which are generated from the main word decoder. The sub array 10 may operate in response to the word line driving signal (PXI).

Referring to FIG. 3, the sub word line driving circuit may include a PMOS transistor (MP), a first NMOS transistor (MN1) and a second NMOS transistor (MN2).

The PMOS transistor (MP) may include a gate to be applied with the main word line driving signal (NEW1), a source to be applied with the first sub word line control signal (PXID), and a drain connected to a node (ND).

The first NMOS transistor (MN1) may include a gate to be applied with the main word line driving signal (NEW1), a drain connected to the node (ND), and a source connected to a ground (VSS).

The second NMOS transistor (MN2) may include a gate to be applied with the second sub word line control signal (PXIB), a drain connected to the node (ND), and a source connected to the ground (VSS). The node (ND) may be electrically connected to the word line (WL1).

In the embodiments described below, the semiconductor device will be exemplified and described as the sub word line driver of a dynamic random access memory (DRAM) device. However, according to the present disclosure, the semiconductor device may not be limited to the sub word line driver of the DRAM only.

Figure 4:
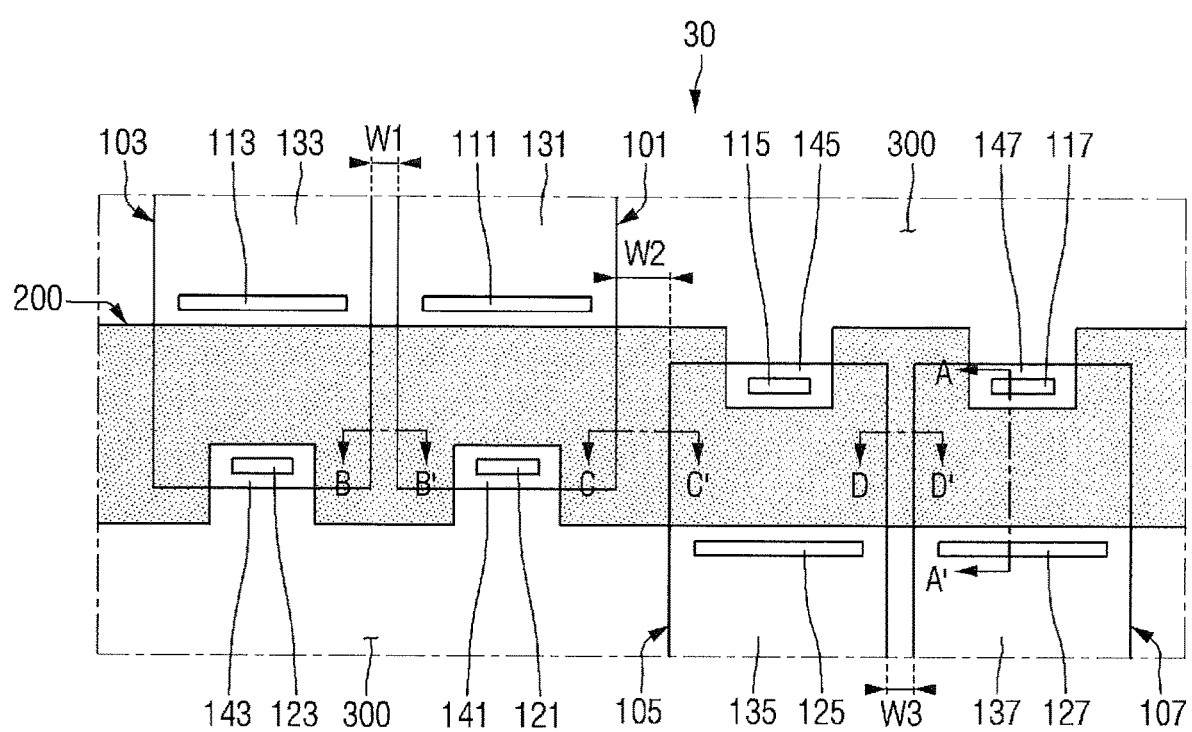
FIG. 4 is a layout diagram illustrating a sub word line driver of a semiconductor device according to some exemplary embodiments.

FIG. 4 is a layout diagram provided to explain a sub word line driver of a semiconductor device according to some exemplary embodiments.

The sub word line drive region 30 of the semiconductor device according to some exemplary embodiments includes first to fourth active regions 101, 103, 105, 107, a device isolation film 300, and a gate structure 200.

Figure 7:
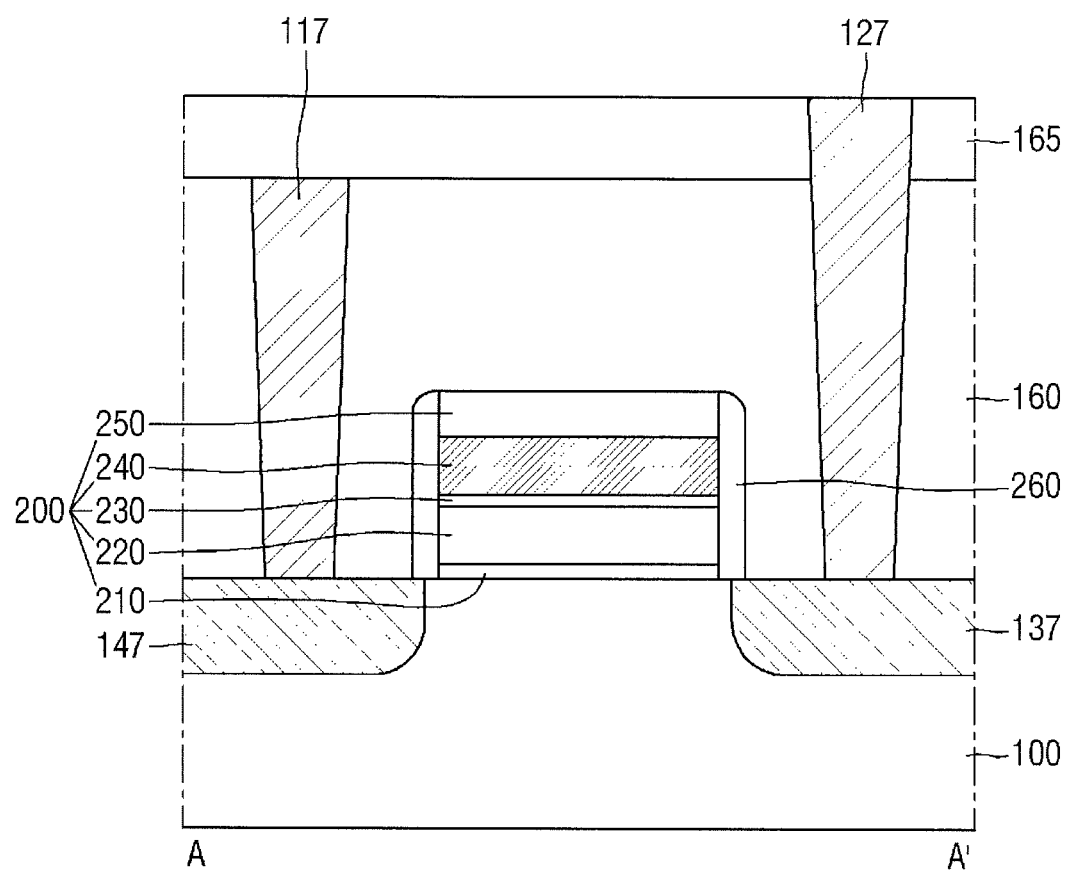
FIG. 7 is a cross sectional view taken along line A-A' of FIG. 4 according to an exemplary embodiment.
Figure 8:
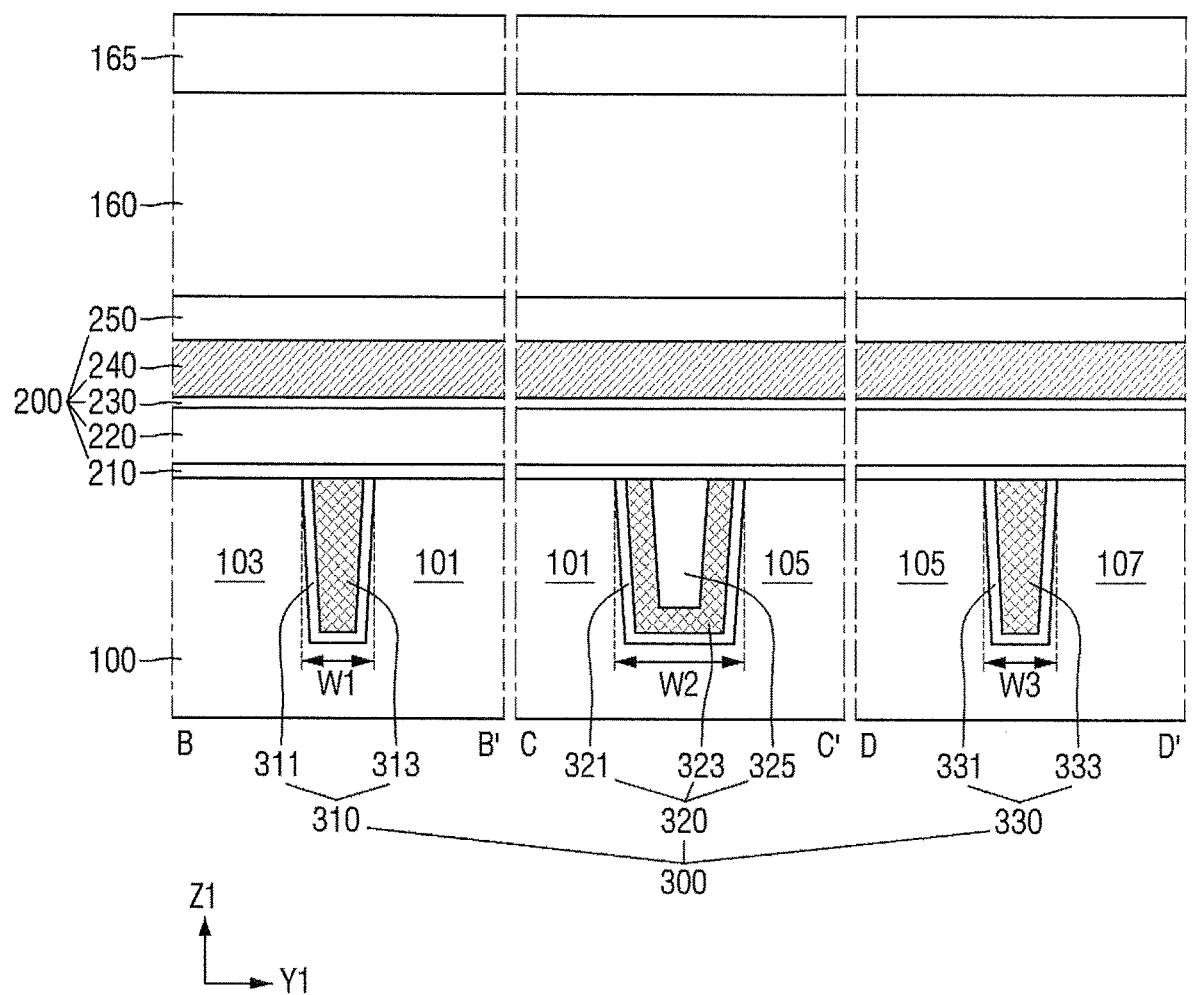
FIG. 8 is a cross sectional view taken along lines B-B', C-C' and D-D' of FIG. 4 according to an exemplary embodiment.

The first to fourth active regions 101, 103, 105, 107 may be a part of the substrate 100 of FIGS. 7 and 8. The first to fourth active regions 101, 103, 105, 107 may be defined by the device isolation film 300 which will be explained below. That is, the first to fourth active regions 101, 103, 105, 107 may be spaced apart from each other by the device isolation film 300. In other words, when seen from a horizontal direction, as shown in the layout diagram of FIG. 4, the whole region may be divided by the first to fourth active regions 101, 103, 105, 107 and the device isolation film 300 isolating the first to fourth active regions respectively.

The first to fourth active regions 101, 103, 105, 107 may extend in a first direction X1, respectively. The expression "extend in a first direction X1" as used herein indicates that a long side extending in the first direction is included. This means that a length of the side in the first direction X1 is longer than a length of the side in the second direction Y1 intersecting the first direction X1. That is, the first to fourth active regions 101, 103, 105, 107 may include a long side extending in the first direction X1, and a short side extending in the second direction Y1.

The first to fourth active regions 101, 103, 105, 107 may be spaced apart from one another in the second direction Y1. In this example, the second direction Y1 may be the direction which intersects the first direction X1. That is, the second direction Y1 may be the direction which is not parallel to the first direction X1. Specifically, the second direction Y1 may be the direction perpendicular to the first direction X1, but not limited hereto.

The first active region 101 may be positioned between the second active region 103 and the third active region 105 in the second direction Y1. The third active region 105 may be positioned between the first active region 101 and the fourth active region 107 in the second direction Y1. Accordingly, with reference to the second direction Y1, the active regions may be disposed sequentially in an order of the second active region 103, the first active region 101, the third active region 105 and the fourth active region 107.

In this example, the first active region 101 and the second active region 103 may be spaced apart from each other by a first pitch W1. The first active region 101 and the third active region 105 may be spaced apart from each other by a second pitch W2. The third active region 105 and the fourth active region 107 may be spaced apart from each other by a third pitch W3. In this example, the first pitch W1 may be narrower than the second pitch W2, and the third pitch W3 may be narrower than the second pitch W2.

The first active region 101 and the second active region 103 may be entirely overlapped with each other in the second direction Y1. That is, as illustrated, a lower end portion of the first direction X1 in the first active region 101 and a lower end portion of the first direction X1 in the second active region 103 may be disposed at the same level. Although not illustrated, upper end portions of the first direction X1 in the first active region 101 and the second active region 103 may be disposed at the same level as well.

In an embodiment, the third active region 105 and the fourth active region 107 may be entirely overlapped with each other in the second direction Y1. That is, as illustrated, a lower end portion of the first direction X1 in the third active region 105 and an upper end portion of the first direction X1 in the fourth active region 107 may be disposed at the same level. Although not illustrated, upper end portions of the first direction X1 in the third active region 105 and the fourth active region 107 may be disposed at the same level as well.

In an embodiment, the first active region 101 and the third active region 105 may be only partially overlapped with each other in the second direction Y1. That is, a lower end portion of the first active region 101 in the first direction X1 may be disposed higher than a lower end portion of the third active region 105, and an upper end portion of the first active region 101 may be disposed higher than an upper end portion of the third active region 105. That is, the first active region 101 and the third active region 105 may be disposed in misalignment with each other so as to have offset in the first direction X1. Alternatively, the first active region 101 may be disposed in misalignment with each other further in a downward direction with reference to the first direction X1.

Figure 5:
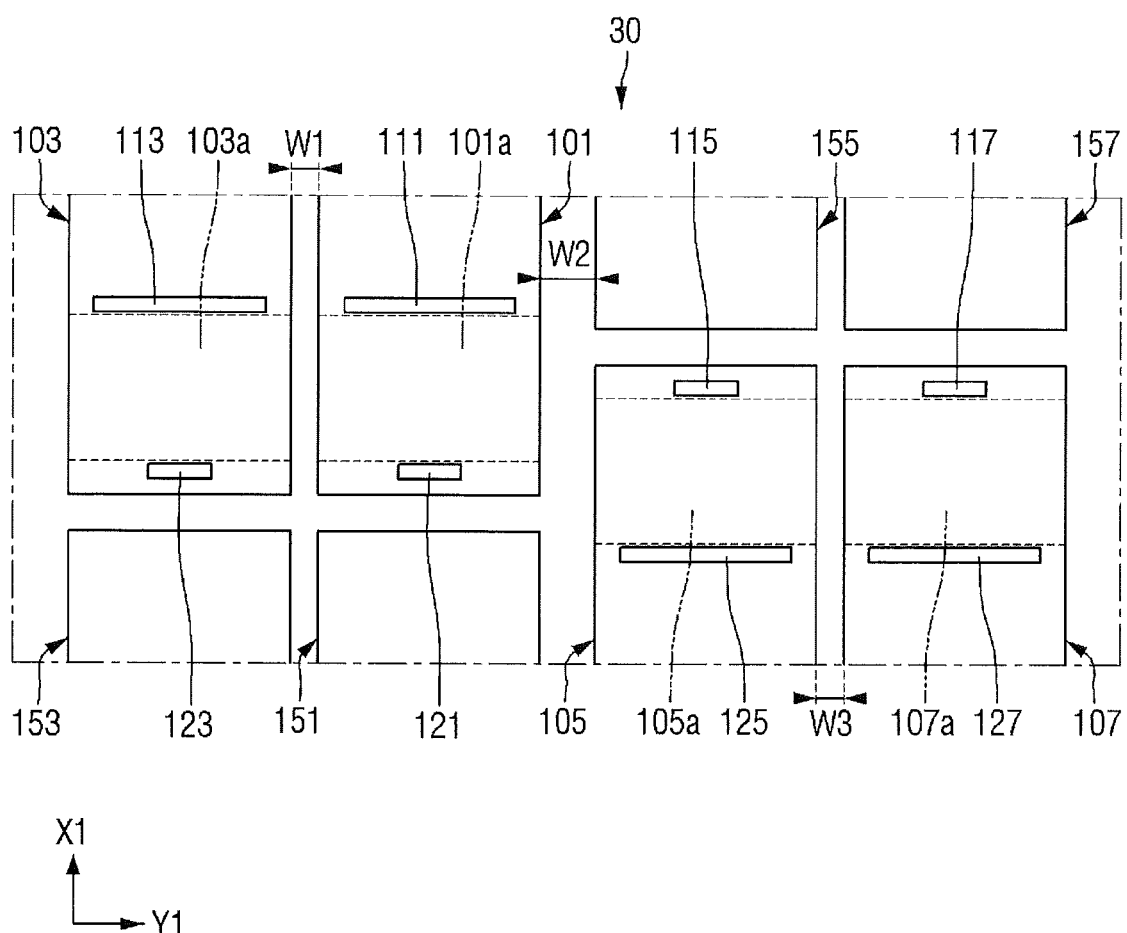
FIG. 5 is a layout diagram illustrating arrangement of an active region of FIG. 4.

FIG. 5 is a layout diagram provided to explain arrangement of an active region of FIG. 4.

Referring to FIG. 5, by removing the gate structure 200 in FIG. 4 and adding another active region which is not described in FIG. 4, the arrangement of the first and fourth active regions 101, 103, 105, 107 will be specifically explained.

The first to fourth active regions 101, 103, 105, 107 may respectively include first to fourth source contacts 111, 113, 125, 127 and first to fourth drain contacts 121, 123, 115, 117, respectively. Specifically, the first source contact 111 and the first drain contact 121 may be formed in the first active region 101, the second source contact 113 and the second drain contact 123 may be formed in the second active region 103, the third source contact 125 and the third drain contact 115 may be formed in the third active region 105, and the fourth source contact 127 and the fourth drain contact 117 may be formed in the fourth active region 107.

Referring to the drawing, the first source contact 111 and the first drain contact 121 may be formed in a downward direction along the first direction X1 in the first active region 101, and the second source contact 113 and the second drain contact 123 may be formed in a downward direction along the first direction X1 in the second active region 103. That is, in the first active region 101 and the second active region 103, the directions of the first source contact 111 and the first drain contact 121 and the directions of the second source contact 113 and the second drain contact 123 may be identical to each other.

Referring to the drawing, the third source contact 125 and the third drain contact 115 may be formed in an upward direction along the first direction X1 in the third active region 105, and the fourth source contact 127 and the fourth drain contact 117 may be formed in an upward direction along the first direction X1 in the fourth active region 107. That is, in the third active region 105 and the fourth active region 107, the directions of the third source contact 125 and the third drain contact 115 and the directions of the fourth source contact 127 and the fourth drain contact 117 may be identical to each other.

In an embodiment, in the first active region 101 and the third active region 105, the directions of the first source contact 111 and the first drain contact 121 may be opposite the directions of the third source contact 125 and the third drain contact 115. Accordingly, in a downward direction with reference to the first direction X1, the first source contact 111 may be disposed earlier than the first drain contact 121 in the first active region 101, but the third drain contact 115 may be disposed earlier than the third source contact 125 in the third active region 105.

As described above, because the first active region 101 and the third active region 105 are disposed in misalignment with each other, the first source contact 111 and the first drain contact 121 of the first active region 101 may also be disposed in misalignment with the third source contact 125 and the third drain contact 115 of the third active region 105.

Referring to FIGS. 4 and 5, the contacts may be disposed in a downward direction with reference to the first direction X1 in an order of the first source contact 111, the third drain contact 115, the first drain contact 121 and the third source contact 125.

In the first active region 101, a region between the first source contact 111 and the first drain contact 121 may be defined as a first spanning region 101a. Likewise, in the second active region 103, a region between the second source contact 113 and the second drain contact 123 may be defined as a second spanning region 103a, and in the third active region 105, a region between the third source contact 125 and the third drain contact 115 may be defined as a third spanning region 105a, and in the fourth active region 107, a region between the fourth source contact 127 and the fourth drain contact 117 may be defined as a fourth spanning region 107a.

The first spanning region 101a and the second spanning region 103a may be entirely overlapped with each other in the second direction Y1. That is, the first spanning region 101a and the second spanning region 103a may be aligned entirely in the second direction Y1. This may be due to the first source contact 111, the second source contact 113, the first drain contact 121, and the second drain contact 123 being disposed in alignment with each other in the first active region 101 and the second active region 103.

In an embodiment, the third spanning region 105a and the fourth spanning region 107a may be overlapped entirely in the second direction Y1. That is, a third spanning region 105a and a fourth spanning region 107a may be aligned entirely in the second direction Y1. This may be due to the third source contact 125, the fourth source contact 127, the third drain contact 115, and the fourth drain contact 117 being disposed in alignment with each other in the third active region 105 and the fourth active region 107.

In an embodiment, the first spanning region 101*a* and the third spanning region 105*a* may be only partially overlapped in the second direction Y1. In other words, the first spanning region 101*a* and the third spanning region 105*a* may be disposed in misalignment with each other so as to have offset in the first direction X1. This may be due to the first source contact 111, the third source contact 125, the first drain contact 121 and the third drain contact 115 being disposed in misalignment with each other in the first active region 101 and the third active region 105.

Fifth to eighth active regions 151, 153, 155, 157 may be disposed with spacing apart from the first to fourth active regions 101, 103, 105, 107 in the first direction X1 respectively. In an embodiment, the fifth active region 101 may be positioned under the first active region 101 in the first direction X1, and the sixth active region 153 may be positioned under the second active region 103 in the first direction X1. The fifth active region 151 and the sixth active region 153 may be disposed to be entirely overlapped in the second direction Y1, likewise the arrangement of the first active region 101 and the second active region 103. Further, the fifth active region 151 and the sixth active region 153 may be disposed to be only partially overlapped with the third active region 105 and the fourth active region 107 in the second direction Y1.

In an embodiment, the seventh active region 155 may be positioned above the third active region 105 in the first direction X1, and the eighth active region 157 may be positioned above the fourth active region 107 in the first direction X1. The seventh active region 155 and the eighth active region 157 may be disposed to be entirely overlapped in the second direction Y1, likewise the arrangement of the third active region 105 and the fourth active region 107. Further, the seventh active region 155 and the eighth active region 157 may be disposed to be only partially overlapped with the first active region 101 and the second active region 103 in the second direction Y1.

Such misalignment of the active regions can ensure maximum space margin for the wires to be formed on the upper layers. That is, because the upper wires to be connected to the source contact and the drain contact are disposed so that connecting the first to fourth drain contacts 121, 123, 115, 117 to the upper wires extending in the second direction Y1 is facilitated as shown in the drawing, the overall integration density of the semiconductor device can be enhanced. In other words, with the active regions being disposed in misalignment and the source/drain contacts in the first active region 101 and the third active region 105 being disposed alternately in reverse order, the interval between the drain contacts in the first direction X1 can be reduced, thus significantly facilitating connecting with the upper wires. According to some embodiments, the source contacts instead of the drain contacts may be disposed with a reduced pitch.

Referring to FIG. 4, the first active region 101 includes the first source region 131 and the first drain region 141. The first source region 131 and the first drain region 141 may be positioned in the opposite directions to each other based on the gate structure 200. For example, an upper portion of the gate structure 200 may be the first source region 131 and a lower portion may be the first drain region 141, as illustrated.

In an embodiment, the second active region 103 includes the second source region 133 and the second drain region 143. The second source region 133 and the second drain region 143 may be positioned in the opposite directions to each other based on the gate structure 200. For example, as illustrated, an upper portion of the gate structure 200 may be the second source region 133 and a lower portion may be the second drain region 143. That is, the first active region 101 and the second active region 103 may have the same arrangement of the source/drain regions.

The third active region 105 includes the third source region 135 and the third drain region 145. The third source region 135 and the third drain region 145 may be positioned in the opposite directions to each other based on the gate structure 200. For example, as illustrated, a lower portion of the gate structure 200 may be the third source region 135 and an upper portion may be the third drain region 145.

In an embodiment, the fourth active region 107 includes the fourth source region 137 and the fourth drain region 147. The fourth source region 137 and the fourth drain region 147 may be positioned in the opposite directions to each other based on the gate structure 200. For example, as illustrated, a lower portion of the gate structure 200 may be the fourth source region 137, and an upper portion may be the fourth drain region 147. That is, the third active region 105 and the fourth active region 107 may have the same arrangement of the source/drain regions.

The source/drain arrangement in the first active region 101 and the second active region 103 may be opposite the source/drain arrangement in the third active region 105 and the fourth active region 107. That is, based on the gate structure 200, the first source region 131, the second source region 133, the third drain region 145, and the fourth drain region 147 may be formed in an upper direction, and the first drain region 141, the second drain region 143, the third source region 135, and the fourth source region 137 may be formed in a lower direction.

The first source contact 111 may be faulted in the first source region 131, and the first drain contact 121 may be formed in the first drain region 141. The second source contact 113 may be formed in the second source region 133, and the second drain contact 123 may be formed in the second drain region 143. The third source contact 125 may be formed in the third source region 135, and the third drain contact 115 may be formed in the third drain region 145. The fourth source contact 127 may be formed in the fourth source region 137, and the fourth drain contact 117 may be formed in the fourth drain region 147.

The source contacts and the drain contacts may be in contact with the upper wires and electrically connected thereto. In this example, a length of each of the first to fourth source contacts 111, 113, 125, 127 in the second direction Y1 may be longer than a length of each of the first to fourth drain contacts 121, 123, 115, 117 in the second direction Y1.

In the semiconductor device according to some exemplary embodiments, the source contacts are longer than the drain contacts so that ON-currents are increased. Accordingly, operating performance can be maximized. However, the exemplary embodiments are not limited to the example given above. Accordingly, in the semiconductor device according to some exemplary embodiments, the source contacts may have the same length as the drain contacts.

Figure 6:
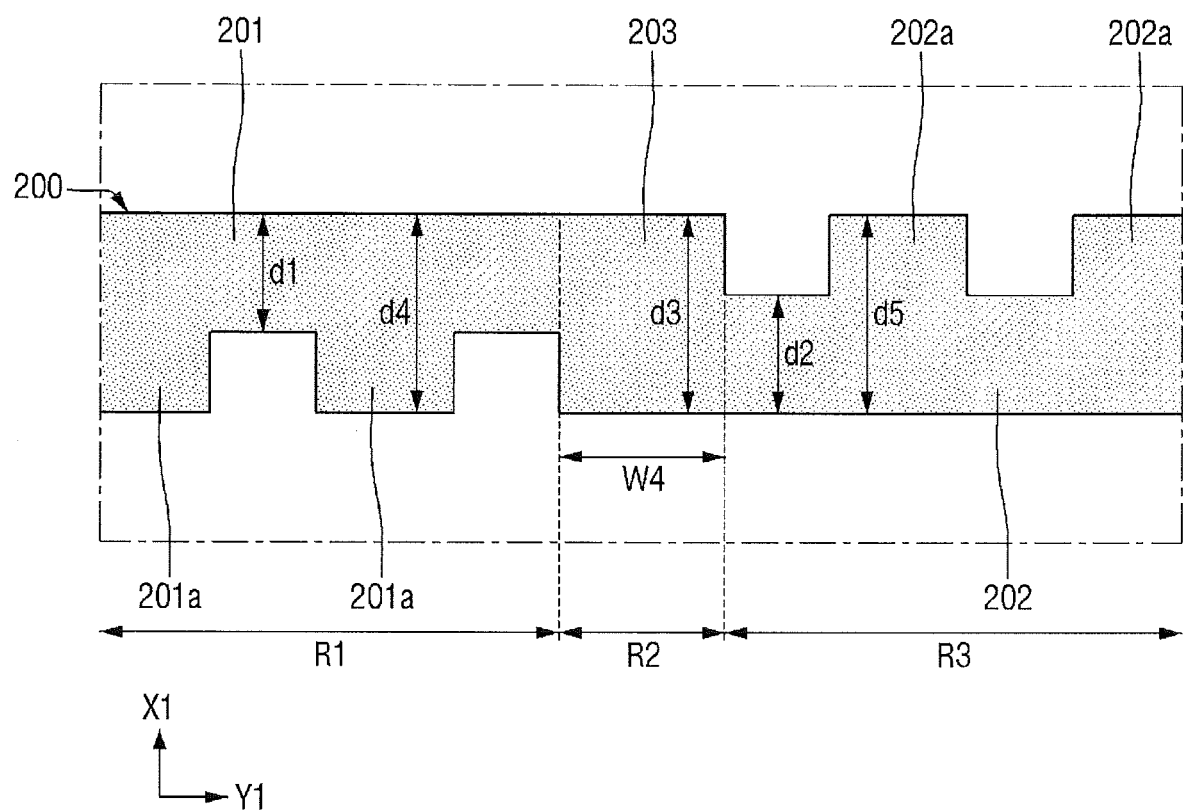
FIG. 6 is a layout diagram illustrating the gate structure of FIG. 4.

FIG. 6 is a layout diagram provided to explain the gate structure of FIG. 4.

Referring to FIGS. 4 and 6, the gate structure 200 may include a first portion 201, a second portion 202, and a third portion 203.

The gate structure 200 may extend in the second direction Y1, and a region extending in the second direction Y1 may be divided into a first region R1, a second region R2, and a third region R3. Referring to FIG. 4, the first region R1 may be a region where the first active region 101 and the second active region 103 are formed, the second region R2 may be a region where the first active region 101 and the third active region 105 are formed, and the third region R3 may be a region where the third active region 105 and the fourth active region 107 are formed.

The first portion 201 may be formed in the first region R1. The first portion 201 may be formed on the first active region 101 and the second active region 103. The first portion 201 may have a first width d1 in the first direction X1 while having a plurality of first projecting portions 201a having a fourth width d4 greater than the first width d1.

Referring to FIG. 4, the first projecting portion 201a may be projecting in a direction of the first drain region 141 and the second drain region 143, and may have a shape of surrounding the first drain contact 121 and the second drain contact 123.

The first projecting portion 201a may be formed on the device isolation film 300 surrounding the first active region 101 and the second active region 103. As a result, the first projecting portion 201a may minimize the phenomenon in which electrons are trapped in the device isolation film 300 or the gate insulating film 210 during an operation of the semiconductor device according to some exemplary embodiments. As a result, the HEIP phenomenon and the operating performance of the semiconductor device may be enhanced. Accordingly, leakage current in OFF-state may be reduced.

Referring to FIG. 6, the second portion 202 may be formed in the third region R3. The second portion 202 may be formed on the third active region 105 and the fourth active region 107. The second portion 202 may have a second width d2 in the first direction X1 while having a plurality of second projecting portions 202a having a fifth width d5 greater than the second width d2.

Referring to FIG. 4, the second projecting portion 202a may be projecting in a direction of the third drain region 145 and the fourth drain region 147, and may have a shape of surrounding the third drain contact 115 and the fourth drain contact 117.

The second projecting portion 202a may be formed on the device isolation film 300 surrounding the third active region 105 and the fourth active region 107. As a result, the second projecting portion 202a may minimize the phenomenon in which electrons are trapped in the device isolation film 300 or the gate insulating film 210 during an operation of the semiconductor device according to some exemplary embodiments. As a result, the HEIP phenomenon and the operating performance of the semiconductor device may be enhanced. Accordingly, leakage current in OFF-state may be reduced.

With the alternate arrangement of the source/drain regions, projecting directions of the first projecting portion 201a and the second projecting portion 202a may be opposite each other. In order for the gate structure 200 including the projecting portion to have a width in the first direction X1 effectively, the first portion 201 and the second portion 202 may be disposed in misalignment with each other in the first direction X1. That is, in the second direction Y1, the first portion 201 and the second portion 202 excluding the first projecting portion 201a and the second projecting portion 202a may be only partially overlapped with each other.

The third portion 203 may be positioned in the second region R2. Referring to FIG. 4, the third portion 203 may be formed on the first active region 101 and the third active region 105. The third portion 203 may be a portion where the first portion 201 and the second portion 202 are connected to each other. The third portion 203 may have a third width d3 in the first direction X1. The third width d3 may be greater than the first width d1 and the second width d2. The third width d3 may be greater than the fourth width d4 and the fifth width d5. However, exemplary embodiments are not limited to the example given above. That is, the third width d3 may be smaller than the fourth width d4 and the fifth width d5.

The first portion 201 and the second portion 202 may be spaced apart from each other by a fourth pitch W4 in the second direction Y1, which may be the same as a width of the third portion 203 in the second direction Y1. The fourth pitch W4 may be greater than the second pitch W2.

FIG. 7 is a cross sectional view taken along line A-A' of FIG. 4. FIG. 7 only illustrates a cross section of the fourth active region 107, but cross sections of the first active region 101, the second active region 103, and the third active region 105 may be same as the illustrated cross section. Accordingly, the semiconductor device according to some exemplary embodiments will be described below using the cross section of the fourth active region 107 for convenience of explanation.

Referring to FIGS. 4 and 7, the semiconductor device according to some exemplary embodiments may additionally include a substrate 100.

The substrate 100 may be formed of one or more semiconductor materials selected from a group consisting of Si, Ge, SiGe, GaP, GaAs, SiC, SiGeC, InAs and InP. Further, a silicon on insulator (SOI) substrate may be used.

Referring to FIG. 4, the substrate 100 may include the first to fourth active regions 101, 103, 105, 107, and a device isolation film 300 defining the first to fourth active regions 101, 103, 105, 107. That is, the device isolation film 300 may be formed in a buried form by etching the substrate 100, and the first to fourth active regions 101, 103, 105, 107 may be the rest, un-etched portions of the device isolation film 300 that is etched.

The gate structure 200 may be formed on the substrate 100. The gate structure 200 may be a structure in which a plurality of layers is stacked. Specifically, the gate structure 200 may include a gate insulating film 210, a first conductive film 220, a barrier film 230, a second conductive film 126, and a capping film 250.

The gate insulating film 210 may be formed on the substrate 100, along an upper surface of the substrate 100. For example, the gate insulating film 210 may include at least one of silicon oxide, silicon nitride and silicon oxynitride. However, exemplary embodiments are not limited to the example given above.

The first conductive film 220 may be formed on the gate insulating film 210. The first conductive film 220 may include a conductor. For example, the first conductive film 220 may include polysilicon. However, exemplary embodiments are not limited to the example given above.

The barrier film 230 may be formed on the first conductive film 220. The barrier film 230 may play a role of preventing diffusion of oxygen or adjusting a work function. The barrier film 230 may include a conductor such as TiN, TaN, or the like. However, exemplary embodiments are not limited to the example given above.

The second conductive film 126 may be formed on the barrier film 230. The second conductive film 126 may include tungsten W. However, exemplary embodiments are not limited to the example given above.

The capping film 250 may be formed on the second conductive film 126. The capping film 250 may include, for example, a silicon nitride film, but not limited hereto.

The gate structure 200 may be a stacked structure of a plurality of layers described above. A spacer 260 may be formed on a side surface of the gate structure 200. For example, the spacer 260 may include at least one of silicon nitride (SiN), silicon oxynitride (SiON), silicon oxide ($SiO_2$), silicon oxycarbonitride (SiOCN), and a combination thereof. However, exemplary embodiments are not limited to the example given above.

The fourth source region 137 and the fourth drain region 147 may be formed on both sides of the gate structure 200 respectively. The fourth source region 137 and the fourth drain region 147 may be formed in the opposite directions to each other based on the gate structure 200.

The first interlayer insulating film 160 may overlie the gate structure 200, the spacer 260, the fourth source region 137 and the fourth drain region 147. For example, the first interlayer insulating film 160 may include at least one of silicon oxide, silicon nitride, silicon oxynitride, and a low-k dielectric material with a smaller dielectric constant than silicon oxide.

The fourth drain contact 117 may be in contact with the fourth drain region 147 by penetrating through the first interlayer insulating film 160 in a third direction Z1. The fourth drain contact 117 may electrically connect the fourth drain region 147 with the upper wires.

The second interlayer insulating film 165 may be formed on the first interlayer insulating film 160. For example, the second interlayer insulating film 165 may include at least one of silicon oxide, silicon nitride, silicon oxynitride, and a low-k dielectric material with a smaller dielectric constant than silicon oxide.

The fourth source contact 127 may be in contact with the fourth source region 137 by penetrating through the first interlayer insulating film 160 and the second interlayer insulating film 165 in the third direction Z1. The fourth source contact 127 may electrically connect the fourth source region 137 with the upper wires.

While FIG. 7 exemplifies that the fourth source contact 127 is penetrated through the first interlayer insulating film 160 and the second interlayer insulating film 165 and have a relatively higher upper surface, and the fourth drain contact 117 is penetrated through the first interlayer insulating film 160 and have a relatively lower upper surface in FIG. 7, exemplary embodiments may not be limited hereto. In the semiconductor device according to some exemplary embodiments, heights of the source contact and the drain contact may be varied depending on purpose and fabrication process.

FIG. 8 is a cross sectional view taken along lines B-B', C-C' and D-D' of FIG. 4.

Referring to FIGS. 4 and 8, the device isolation film 300 may include a first device isolation film 310, a second device isolation film 320, and a third device isolation film 330.

The first device isolation film 310 may be positioned between the first active region 101 and the second active region 103. The second device isolation film 320 may be positioned between the first active region 101 and the third active region 105. The third device isolation film 330 may be positioned between the third active region 105 and the fourth active region 107.

The first device isolation film 310 may have a first pitch W1 as a width, and the second device isolation film 320 may have a second pitch W2 as a width. The third device isolation film 330 may have a third pitch W3 as a width. In this example, the second pitch W2 may be greater than the first pitch W1 and the third pitch W3.

The first device isolation film 310 and the third device isolation film 330 may be a double-layered structure. Alternatively, the second device isolation film 320 may be a triple-layered structure. Specifically, the first device isolation film 310 may include a first device isolation film liner 311 and a first device isolation film insulating film 313. In this example, the first device isolation film liner 311 may be formed along a surface of a device isolation film trench, and the first device isolation film insulating film 313 may be formed thereon, while entirely filling the trench.

The third device isolation film 330 may include a third device isolation film liner 331 and a third device isolation film insulating film 333. In this example, the third device isolation film liner 331 may be formed along a surface of the device isolation film trench, and the third device isolation film insulating film 333 may be formed thereon, while entirely filling the trench.

The second device isolation film 320 may include a second device isolation film inner liner 323, a second device isolation film outer liner 321, and a second device isolation film insulating film 325. In this example, the second device isolation film inner liner 323 may be formed along a surface of the device isolation film trench, and the second device isolation film outer liner 321 may be formed along a surface of the second device isolation film inner liner 323, and the second device isolation film insulating film 325 may be formed thereon, while entirely filling the trench.

In an embodiment, the first device isolation film liner 311, the second device isolation film inner liner 323 and the third device isolation film liner 331 may all include a same material. For example, the first device isolation film liner 311, the second device isolation film inner liner 323 and the third device isolation film liner 331 may all include a silicon oxide film.

The first device isolation film insulating film 313, the second device isolation film outer liner 321 and the third device isolation film insulating film 333 may all include a same material. For example, the first device isolation film insulating film 313, the second device isolation film outer liner 321 and the third device isolation film insulating film 333 may all include a silicon nitride film.

The second device isolation film insulating film 325 may include, for example, a silicon nitride film. The second device isolation film insulating film 325 may be a silicon oxide film having the same property (stress, deposition method, or the like) as the first device isolation film liner 311, the second device isolation film inner liner 323 and the third device isolation film liner 331, or may be a silicon oxide film having different property.

The gate structure 200 may be formed on the device isolation film 300 and the first to fourth active regions 101, 103, 105, 107. Specifically, the gate insulating film 210, the first conductive film 220, the barrier film 230, the second conductive film 126 and the capping film 250 may be sequentially stacked. The first interlayer insulating film 160 may be formed on the capping film 250 and the second interlayer insulating film 165 may be formed on the first interlayer insulating film 160.

Figure 9:
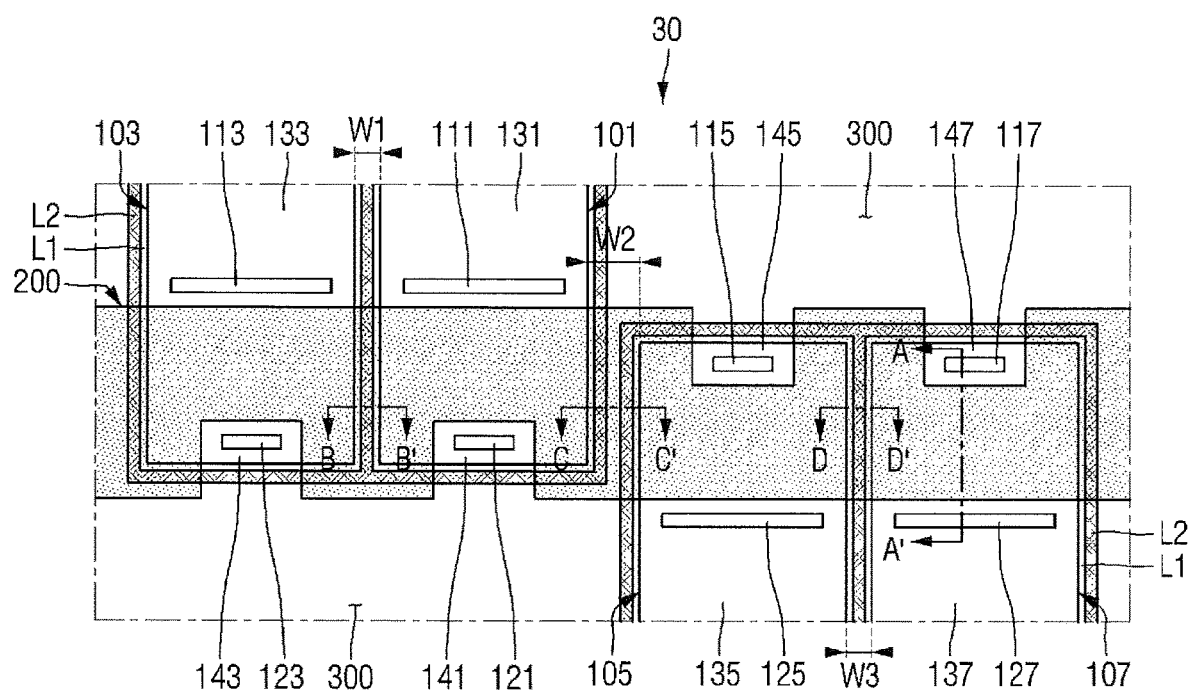
FIG. 9 is a layout diagram illustrating first and second liners, provided to explain a sub word line driver of a semiconductor device according to some exemplary embodiments.

FIG. 9 is a layout diagram illustrating first and second liners, provided to explain a sub word line driver of a semiconductor device according to some exemplary embodiments. FIG. 9 additionally illustrates and specifically explains a first liner L1 and a second liner L2 that are not illustrated in FIG. 4. That is, FIGS. 4 and 9 are the views selectively illustrating constituent elements for convenience of explanation, and they do not illustrate different embodiments from one another.

Referring to FIGS. 8 and 9, the first liner L1 and the second liner L2 may be formed, while surrounding peripheries of the first to fourth active regions 101, 103, 105, 107.

In this example, the first liner L1 of FIG. 9 may include a silicon oxide film and the second liner L2 may include a silicon nitride film. That is, the first liner L1 of FIG. 9 may refer to the first device isolation film liner 311, the second device isolation film inner liner 323, and the third device isolation film liner 331 of FIG. 8. Further, the second liner L2 of FIG. 9 may refer to the first device isolation film insulating film 313, the second device isolation film outer liner 321 and the third device isolation film insulating film 333 of FIG. 8.

That is, the first device isolation film insulating film 313, the second device isolation film outer liner 321 and the third device isolation film insulating film 333 may serve as the second liner L2, and these may be connected to each other in some sections, and may be spaced apart from each other in other sections. Specifically, the second liner is formed to be integrally connected as in the case of the first device isolation film 310 and the third device isolation film 330, but may be spaced apart from each other as in the case of the second device isolation film 320. As illustrated in FIG. 8, all elements may be connected to each other at a lower level.

The device isolation film 300 may be formed as a double-layered structure instead of a triple-layered structure because of a relatively narrower pitch of the first pitch W1 and the third pitch W3 of the first device isolation film 310 and the third device isolation film 330. Conversely, a triple-layered structure may be formed because of the relatively wider second pitch W2 of the second device isolation film 320.

In the case of the first device isolation film 310 and the third device isolation film 330, the HEIP may occur because the second liner L2, which is a silicon nitride film, is integrated and the surfaces are connected to each other on both walls of the trench. That is, the electrons from the operation of the first active region 101 and the second active region 103 may be trapped in the second liner L2, i.e., in the first device isolation film liner 311, and leakage current may be generated in OFF-time. Likewise, the electrons from the operation of the third active region 105 and the fourth active region 107 may be trapped in the second liner L2, i.e., in the third device isolation film liner 331, and leakage current may be generated in OFF-time.

When the first active region 101 and the third active region 105 are spaced apart from each other with a wide spacing, the trapped electrons are blocked from being transferred due to the second device isolation film insulating film 325 formed between the second liner L2, i.e., between the second device isolation film outer liner 321, and accordingly, HEIP can be alleviated and leakage current can be reduced. Accordingly, this can greatly enhance operating performance of the semiconductor device according to some exemplary embodiments.

Because a distance between the first drain region 141 and the third drain region 145 becomes much narrower between the first active region 101 and the third active region 105 where the active regions are formed in misalignment, the phenomenon that the leakage current is generated due to HEIP may be more fatal. Accordingly, degradation due to HEIP can be decreased and efficiency of the semiconductor device can be maximized, by forming a relatively wider second pitch W2.

Because the first device isolation film 310 and the third device isolation film 330 are positioned such that a distance between the source/drain regions of each of the active regions is relatively farther, leakage current can be kept low and the operating performance of the semiconductor device can be optimized, without having to increase the first pitch W1 and the third pitch W3 to decrease the overall integration density.

As described, in the semiconductor device according to some exemplary embodiments, maximum space margin can be secured for the upper wires by the active regions disposed in misalignment, and leakage current due to HEIP can be minimized by relatively increasing a pitch between the misaligned active regions to be relatively wider than a pitch between other non-misaligned active regions. As a result, operating performance of the semiconductor device can be significantly enhanced.

Figure 10:
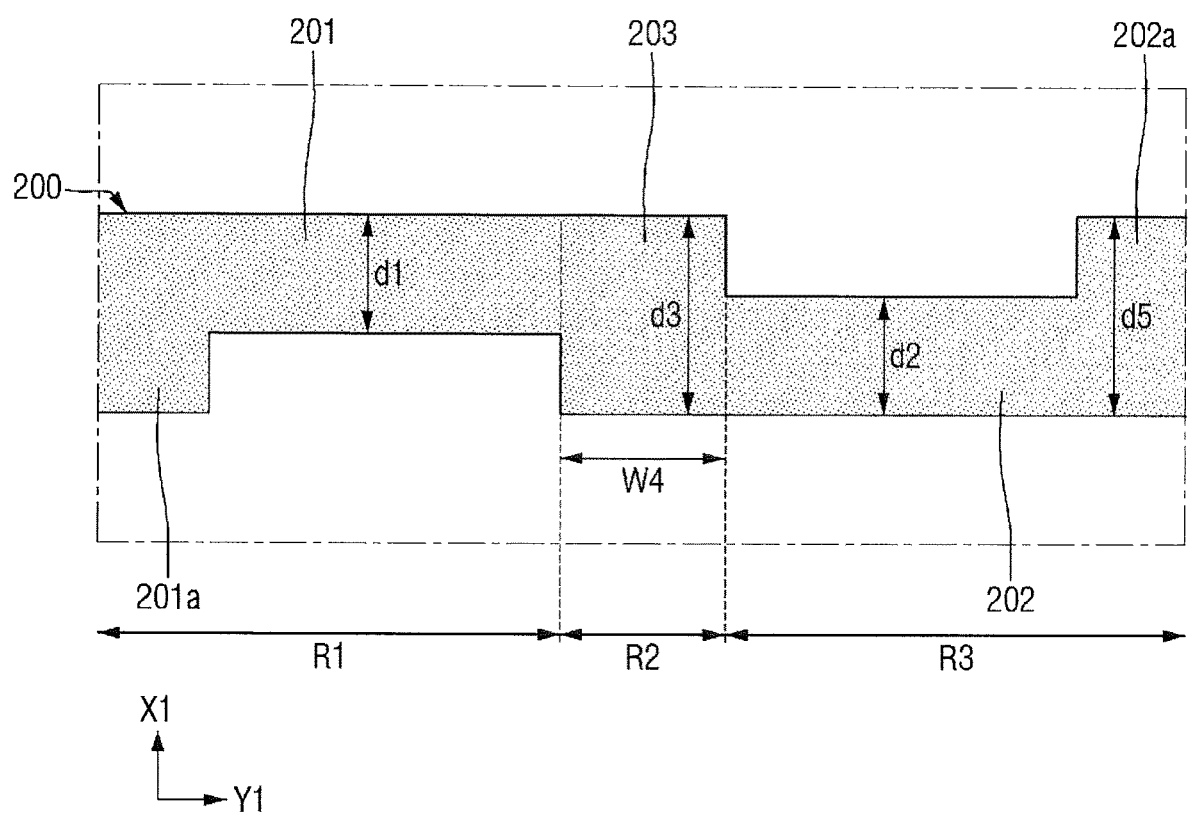
FIG. 10 is a layout diagram illustrating a gate structure of a semiconductor device according to some exemplary embodiments.

FIG. 10 is a layout diagram provided to explain a gate structure of a semiconductor device according to some exemplary embodiments.

Referring to FIG. 10, the first projecting portion 201a may not be positioned between the first active region 101 and the second active region 103, but formed only on an outer perimeter of the second active region 103.

In an embodiment, the second projecting portion 202a may not be positioned between the third active region 105 and the fourth active region 107, but formed only on an outer perimeter of the fourth active region 107. That is, in the case of the first device isolation film 310 and the third device isolation film 330, because the source/drain regions are disposed in a same direction and does not have a considerably large leakage current, the first projecting portion 201a and the second projecting portion 202a may be omitted.

Figure 11:
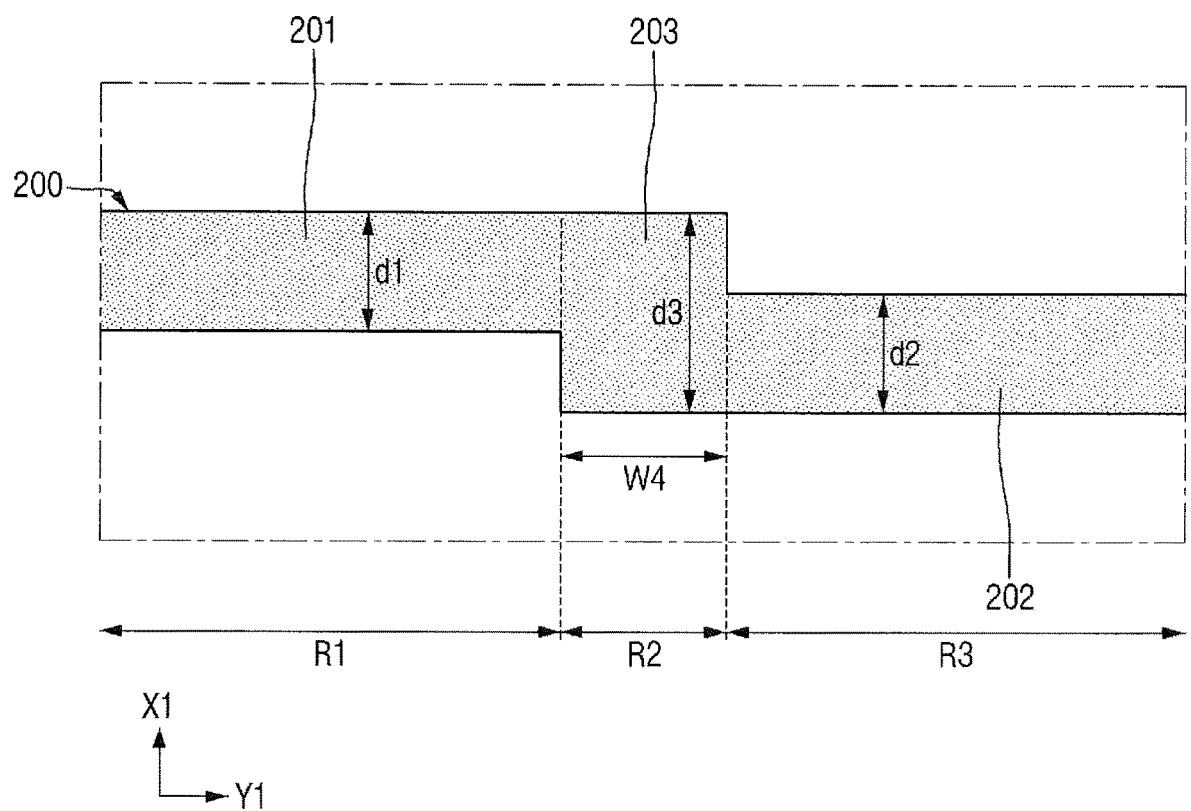
FIG. 11 is a layout diagram illustrating a gate structure of a semiconductor device according to some exemplary embodiments.

FIG. 11 is a layout diagram provided to explain a gate structure of a semiconductor device according to some exemplary embodiments.

Referring to FIG. 11, the gate structure 200 of the semiconductor device according to some exemplary embodiments may only include a portion extending in the second direction Y1, without the first projecting portion 201a and the second projecting portion of FIG. 6.

In the above example, including the third portion 203 for suppressing generation of leakage current due to HEIP in the first active region 101 and the third active region 105 will suffice, because the source/drain regions are disposed in the same direction in the first device isolation film 310 and the second device isolation film 320 such that there is no considerably large leakage current due to HEIP. Therefore, the first projecting portion 201a and the second projecting portion 202a may not be necessary, and space margin for the first to fourth drain contacts 121, 123, 115, 117 can be sufficiently provided.

Hereinbelow, a method for manufacturing a semiconductor device according to some exemplary embodiments will be described below with reference to FIGS. 4, 8 to 9, and 12 to 17.

FIGS. 12 to 17 are views illustrating intermediate stages of fabrication, provided to explain a method for fabricating a semiconductor device according to some exemplary embodiments.

Figure 12:
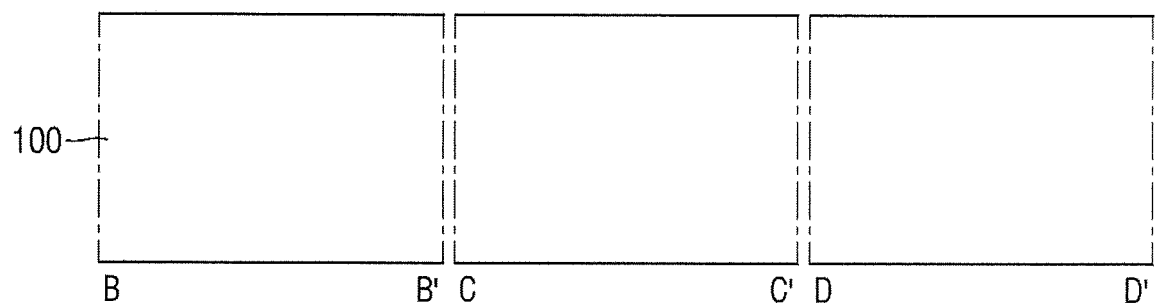
FIGS. 12 to 17 are views illustrating intermediate stages of fabrication, provided to explain a method for fabricating a semiconductor device according to some exemplary embodiments.
Figure 12:
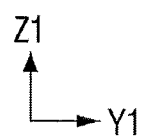

Referring first to FIG. 12, the substrate 100 is prepared.

The substrate 100 may be formed of one or more semiconductor materials selected from a group consisting of Si, Ge, SiGe, GaP, GaAs, SiC, SiGeC, InAs and InP. Further, a silicon on insulator (SOI) substrate may be used.

Figure 13:
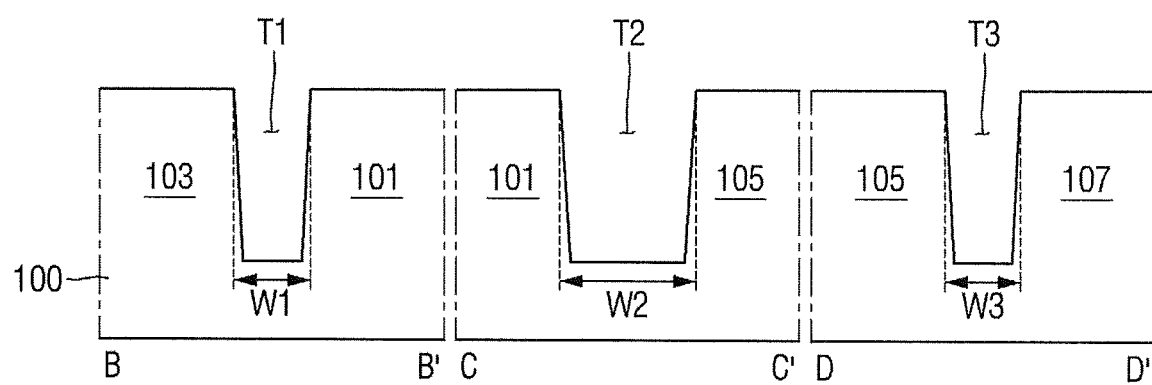
Figure 13:
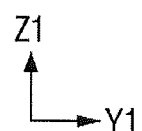

Referring to FIG. 13, the first to fourth active regions 101, 103, 105, 107 may be defined by forming first to third trenches T1, T2, T3.

The first to third trenches T1, T2, T3 may be formed by etching the substrate 100. Specifically, the first trench T1 may separate the first active region 101 and the second active region 103 apart from each other, the second trench T2 may separate the first active region 101 and the third active region 105 apart from each other, and the third trench T3 may separate the third active region 105 and the fourth active region 107 apart from each other.

The first trench T1 may have a width in the second direction Y1 by the first pitch W1, the second trench T2 may have a width in the second direction Y1 by the second pitch W2, and the third trench T3 may have a width in the second direction Y1 by the third pitch W3. At this time, the second pitch W2 may be greater than the first pitch W1 and the third pitch W3.

In this example, referring to FIG. 4, the first to third trenches T1, T2, T3 may be connected to each other integrally (i.e., region of the device isolation film 300 in FIG. 4).

Figure 14:
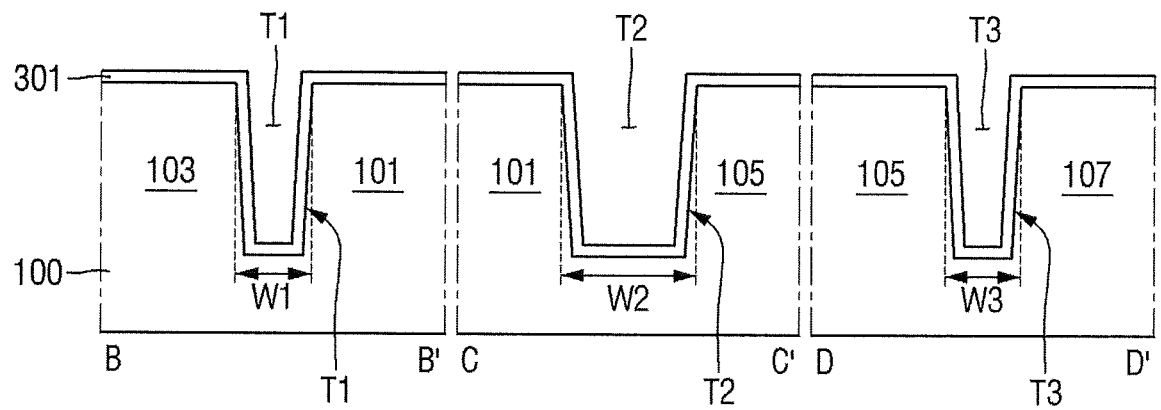

Referring to FIG. 14, a first pre-liner film 301 is formed.

The first pre-liner film 301 may be formed along upper surfaces of the first to fourth active regions 101, 103, 105, 107 and inner walls of the first to third trenches T1, T2, T3. For example, the first pre-liner film 301 may include a silicon oxide film.

Figure 15:
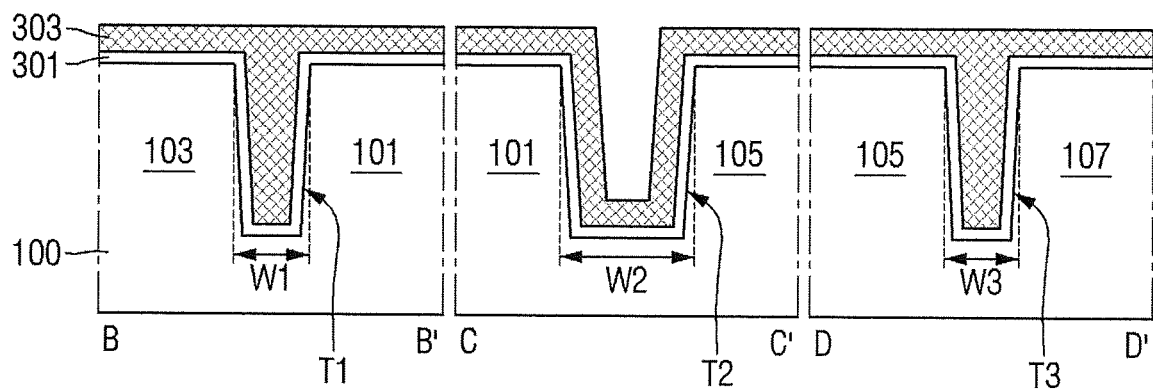

Referring to FIG. 15, a second pre-liner film 303 is formed.

The second pre-liner film 303 may be formed along an upper surface of the first pre-liner film 301. In this example, the first trench T1 and the third trench T3 having a relatively narrower pitch in the second direction Y1 may be entirely filled with the second pre-liner film 303. Conversely, the second trench T2 having a relatively wider pitch in the second direction Y1 may not be entirely filled with the second pre-liner film 303.

Figure 16:
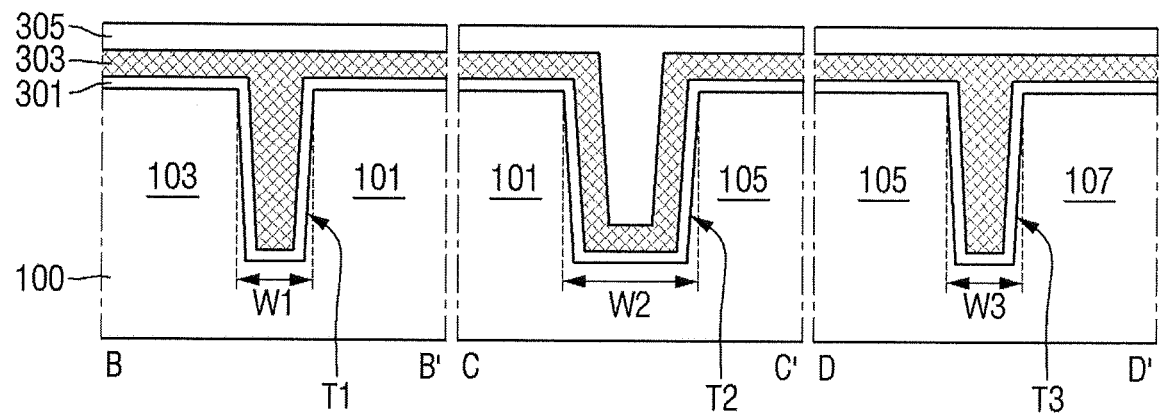

Referring to FIG. 16, a pre-insulating film 305 is formed.

The pre-insulating film 305 may be formed along an upper surface of the second pre-liner film 303. In this example, the second trench T2 may be entirely filled.

Figure 17:
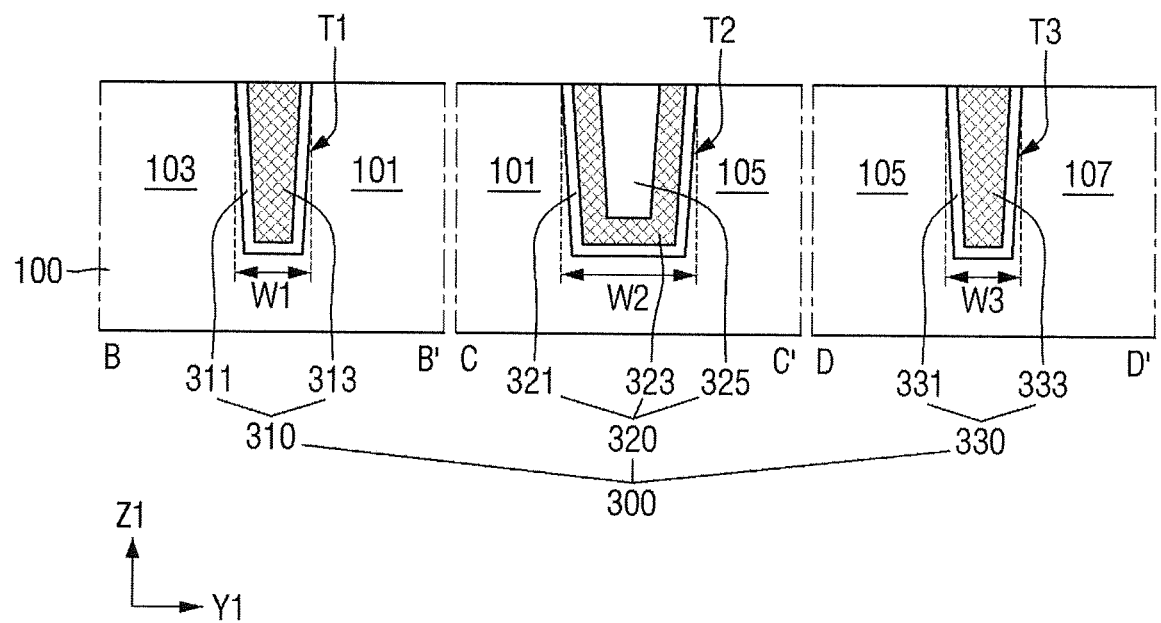

Referring to FIG. 17, the device isolation film 300 is formed through a planarization process.

That is, upon removal of all the portions except for the portions filling the first to third trenches T1, T2, T3, the first device isolation film 310, the second device isolation film 320 and the third device isolation film 330 may be respectively formed only in the first to third trenches T1, T2, T3. Referring to FIG. 4, the first device isolation film 310, the second device isolation film 320, and the third device isolation film 330 may be all connected to each other integrally.

In this example, all of the first pre-liner film 301, the second pre-liner film 303, and the pre-insulating film 305 on the surfaces of the first to fourth active regions 101, 103, 105, 107 may be removed. Accordingly, the first pre-liner film 301 may form the first liner L1 of FIG. 9, i.e., may form the first device isolation film liner 311, the second device isolation film inner liner 323 and the third device isolation film liner 331. The second pre-liner film 303 may form the first device isolation film insulating film 313, the second device isolation film outer liner 321 and the third device isolation film insulating film 333. The pre-insulating film 305 may form the second device isolation film insulating film 325.

Next, referring to FIG. 8, the gate structure 200, the first interlayer insulating film 160 and the second interlayer insulating film 165 are formed.

The method for fabricating a semiconductor device according to some exemplary embodiments may provide a semiconductor device with minimized leakage current due to HEIP, by forming the second trench T2 to be wider than the first trench T1 and the third trench T3.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
   first and second active regions extending in a first direction on a substrate and spaced apart from each other in a second direction intersecting the first direction, wherein the first and second active regions overlaps entirely with each other in the second direction;
   a third active region extending in the first direction on the substrate and spaced apart from the first active region in the second direction, wherein the first active region is positioned between the second and third active regions in the second direction, and the first and third active regions partially overlaps in the second direction;
   a device isolation film configured to define the first to third active regions, wherein the device isolation film comprises a first device isolation film positioned between the first and second active regions and a second device isolation film positioned between the first and third active regions, and a width of the first device isolation film in the second direction is lesser than a width of the second device isolation film in the second direction; and
   a gate structure formed on the first to third active regions and extending in the second direction.

2. The semiconductor device of claim 1, further comprising:
   a first source region and a first drain region formed in the first active region; and
   a second source region and a second drain region formed in the third active region,
   wherein the first source region and the first drain region are disposed in the first direction opposite to the order in which the second source region and the second drain region are disposed.

3. The semiconductor device of claim 2, wherein the first active region between the first source region and the first drain region is only partially overlapped with the third active region between the second source region and the second drain region in the second direction.

4. The semiconductor device of claim 2, further comprising a third source region and a third drain region formed in the second active region, wherein the first source region and the first drain region are disposed in the first direction in the same order as an order in which the third source region and the third drain region are disposed.

5. The semiconductor device of claim 4, wherein the first active region between the first source region and the first drain region is entirely overlapped with the second active region between the third source region and the third drain region in the second direction.

6. The semiconductor device of claim 2, further comprising:
first and second source contacts formed on the first and second source regions; and
first and second drain contacts formed on the first and second drain regions, wherein a length of the first source contact in the second direction is greater than a length of the first drain contact in the second direction, and
a length of the second source contact in the second direction is greater than a length of the second drain contact in the second direction.

7. The semiconductor device of claim 1, wherein the gate structure comprises:
a first portion extending on the first and second active regions in the second direction;
a second portion extending on the third active region in the second direction; and
a third portion connecting the first and second portions and being formed on the first and third active regions, wherein a width of the third portion in the first direction is greater than widths of the first and second portions in the first direction.

8. The semiconductor device of claim 7, further comprising:
a first source region and a first drain region formed in the first active region; and
a second source region and a second drain region formed in the third active region,
wherein the first portion extends in the second direction between the first source region and the first drain region, and the second portion extends in the second direction between the second source region and the second drain region.

9. The semiconductor device of claim 8, wherein the first portion comprises a first projecting portion projecting in a direction where the first drain region is positioned and formed on a side surface of the first drain region in the second direction, and the second portion comprises a second projecting portion projecting in a direction where the second drain region is positioned and formed on a side surface of the second drain region in the second direction.

10. The semiconductor device of claim 9, wherein the first projecting portion is projecting in a different direction from the second projecting portion.

11. The semiconductor device of claim 1, further comprising:
a fourth active region extending on the substrate in the first direction and spaced apart from the third active region in the second direction,
wherein the third active region is positioned between the first and fourth active regions, and the third and fourth active regions are arranged to be entirely overlapped with each other in the second direction, the device isolation film further comprises a third device isolation film positioned between the third and fourth active regions, and a width of the third device isolation film in the second direction is smaller than a width of the second device isolation film in the second direction.

12. A semiconductor device, comprising:
first and second active regions extending in a first direction on a substrate and spaced apart from each other in a second direction intersecting the first direction,
wherein the first and second active regions are arranged so as to be overlapped entirely with each other in the second direction;
a third active region extending in the first direction on the substrate and spaced apart from the first active region in the second direction,
wherein the first active region is positioned between the second and third active regions in the second direction, and the first and third active regions are arranged so as to be only partially overlapped in the second direction; and
a device isolation film configured to define the first to third active regions,
wherein the device isolation film comprises a first device isolation film positioned between the first and second active regions and a second device isolation film positioned between the first and third active regions, the first device isolation film comprises a first liner and a first insulating film formed on the first liner, and the second device isolation film comprises a second liner, a third liner formed on the second liner, and a second insulating film formed on the second liner.

13. The semiconductor device of claim 12, wherein the first insulating film and the second liner comprise a same material.

14. The semiconductor device of claim 12, wherein the device isolation film is formed in a device isolation trench formed in the substrate, the first and second liners are formed along outer walls of the first to third active regions, respectively, the third liner is formed along an upper surface of the second liner, and the first and second insulating films entirely fill the device isolation trench.

15. The semiconductor device of claim 12, wherein the first and second liners are a silicon oxide film, the first insulating film and the third liner are a silicon nitride film, and the second insulating film is a silicon oxide film.

16. The semiconductor device of claim 12, further comprising:
a fourth active region extending on the substrate in the first direction and spaced apart from the third active region in the second direction,
wherein the third active region is positioned between the first and fourth active regions, and the third and fourth active regions are arranged to be entirely overlapped with each other in the second direction, the device isolation film further comprises a third device isolation film positioned between the third and fourth active regions, and the third device isolation film comprises a fourth liner and a third insulating film formed on the fourth liner.

17. A semiconductor device, comprising:
first and second active regions extending in a first direction on a substrate and spaced apart from each other in a second direction intersecting the first direction,
wherein the first and second active regions are arranged so as to be overlapped entirely with each other in the second direction;
a third active region extending in the first direction on the substrate and spaced apart from the first active region in the second direction, wherein the first active region is positioned between the second and third active regions in the second direction, and the first and third active regions are arranged so as to be only partially overlapped in the second direction;
a device isolation film configured to define the first to third active regions; and a gate structure formed on the first to third active regions and extending in the second direction, wherein the gate structure comprises a first portion extending on the first and second active regions in the second direction, a second portion extending on the third active region in the second direction, and a third portion connecting the first and second portions and being formed in the first and third active regions, and a width of the third portion in the first direction is greater than widths of the first and second portions in the first direction, and the third portion does not overlap the first portion and the second portion in the first direction.

18. The semiconductor device of claim 17, further comprising:

a first source region and a first drain region formed in the first active region; and a second source region and a second drain region formed in the third active region, wherein the first portion extends in the second direction between the first source region and the first drain region, and the second portion extends in the second direction between the second source region and the second drain region.

19. The semiconductor device of claim 18, wherein the first portion comprises a first projecting portion projecting in a direction where the first drain region is positioned and formed on a side surface of the first drain region in the second direction, and the second portion comprises a second projecting portion projecting in a direction where the second drain region is positioned and formed on a side surface of the second drain region in the second direction.

20. The semiconductor device of claim 17, wherein the device isolation film comprises a first device isolation film positioned between the first and second active regions, and a second device isolation film positioned between the first and third active regions, and a width of the first device isolation film in the second direction is smaller than a width of the second device isolation film in the second direction.

* * * * *